United States Patent
Labbé

(10) Patent No.: US 7,151,406 B2
(45) Date of Patent: Dec. 19, 2006

(54) COMPENSATION OF NONLINEARITY INTRODUCED BY DEAD TIME IN SWITCHING OUTPUT STAGE

(75) Inventor: Eric Labbé, Sunnyvale, CA (US)

(73) Assignee: Texas Instruments Incorporated, Dallas, TX (US)

( * ) Notice: Subject to any disclaimer, the term of this patent is extended or adjusted under 35 U.S.C. 154(b) by 87 days.

(21) Appl. No.: 11/079,982

(22) Filed: Mar. 15, 2005

(65) Prior Publication Data

US 2006/0208798 A1    Sep. 21, 2006

(51) Int. Cl.
*H03F 3/217* (2006.01)
(52) U.S. Cl. .............. 330/251; 330/207 A; 330/10
(58) Field of Classification Search ............... 330/251, 330/207 A, 10
See application file for complete search history.

(56) References Cited

U.S. PATENT DOCUMENTS

| | | | | |
|---|---|---|---|---|
| 4,562,386 | A * | 12/1985 | Goff et al. | 318/254 |
| 4,763,080 | A * | 8/1988 | Gulczynski | 330/10 |
| 6,107,844 | A * | 8/2000 | Berg et al. | 327/110 |
| 6,304,137 | B1 | 10/2001 | Pullen et al. | 330/10 |
| 2004/0232978 | A1 * | 11/2004 | Easson et al. | 330/10 |
| 2005/0094342 | A1 * | 5/2005 | Kirn | 361/100 |
| 2006/0008095 | A1 * | 1/2006 | Tsuji | 381/104 |

OTHER PUBLICATIONS

The Class-D Amplifier, (From the book Introduction to Electroacoustics and Audio Amplifier Design, Second Edition—Revised Printing, by W.Marshall Leach, Jr., published by Kendall/Hunt, © 2001.
Integrated Current Sensing Circuit Techniques for DC-DC Converters, Hassan Pooya Forghani-zadeh, Advisor: Prof. Gabriel Rincon-Mora, Georgia Tech Analog—Mar. 22, 2002 Review.

\* cited by examiner

*Primary Examiner*—Patricia Nguyen
(74) *Attorney, Agent, or Firm*—W. James Brady, III; Frederick J. Telecky, Jr.

(57) ABSTRACT

A method of operating a class D amplifier output stage that compensates for nonlinearity introduced by a residual load current during the dead time in the switching of the output stage. The amplifier output stage includes an input, a gate driver circuit, two output transistors, an output, and a current sensing circuit. The transistors are serially connected between the terminals of a power supply. A residual load current flows through the transistors when they are switched off. The gate driver circuit increases or decreases the duty cycles of signals driving the transistors based on the direction of the residual load current flowing through the transistors, thereby causing the duty cycle of the amplifier output to remain substantially constant and equal to the duty cycle of the amplifier input.

13 Claims, 3 Drawing Sheets

COMPENSATION OF NONLINEARITY INTRODUCED BY DEAD TIME IN SWITCHING OUTPUT STAGE

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

The present application relates generally to output stages of amplifier circuits, and more specifically to a method of compensating for nonlinearity introduced by the dead time in the switching output stage of a class D amplifier.

The output stage of a conventional class D amplifier typically includes two MOSFET transistors serially connected between upper and lower terminals of a power supply. The two transistors operate as switches to commute the output of the amplifier between the voltage levels at the upper and lower power supply terminals, e.g., $V_P$ and GND. Specifically, when an output transistor is switched "on", the voltage across the transistor is small, e.g., close to 0 volts. Further, when an output transistor is switched "off", the current through the transistor is essentially zero. As a result, the voltage level at the amplifier output can be approximately $V_P$ or GND, depending upon which output transistor is switched on and which one is switched off.

To avoid a large and potentially harmful flow of current between the power supply terminals, the class D amplifier operates such that the two output transistors are not switched on at the same time. Specifically, a predefined non-zero delay or "dead time" is provided from the time one output transistor is switched off to the time the other output transistor is switched on. During this dead time, both output transistors are switched off, and the output of the amplifier is tri-stated, i.e., the amplifier output is in a high impedance state.

The above-described conventional class D amplifier output stage has drawbacks because, in practice, the body diodes of the MOSFET output transistors typically allow a residual load current to flow through the transistors when they are switched off. The direction of this residual load current can define the state of the amplifier output during the dead time in the switching of the output stage. Further, because it is not directly related to the input of the amplifier, the residual load current can cause the duty cycle of the amplifier output to be different from the duty cycle of the amplifier input. As a result, nonlinearity may be introduced in the amplifier output, which can adversely affect specified amplifier performance characteristics such as total harmonic distortion (THD).

It would therefore be desirable to have an improved method of operating the output stage of a class D amplifier that avoids the drawbacks of the above-described conventional class D amplifier output stage.

BRIEF SUMMARY OF THE INVENTION

In accordance with the present invention, a method of operating a class D amplifier output stage is provided that compensates for nonlinearity introduced by residual load currents during the dead time in the switching of the output stage. The presently disclosed method compensates for such nonlinearity by controlling the duty cycles of signals driving the output transistors of the output stage, thereby assuring that the duty cycle of the amplifier output remains substantially constant and equal to the duty cycle of the amplifier input.

In one embodiment, a class D amplifier output stage includes an input, a gate driver circuit, first and second MOSFET output transistors, an output, and a current sensing circuit. The first and second output transistors are serially connected between first and second terminals of a power supply. Specifically, each output transistor includes a gate electrode, a source electrode, and a drain electrode. The input of the amplifier output stage is provided to the gate driver circuit, which applies corresponding first and second drive signals to the gate electrodes of the first and second output transistors, respectively. The source electrode of the first output transistor is connected to the first power supply terminal, the drain electrode of the second output transistor is connected to the second power supply terminal, and the drain electrode of the first output transistor is connected to the source electrode of the second output transistor. The output of the amplifier output stage is provided at the connection of the drain and source electrodes of the first and second output transistors, respectively.

In one mode of operation, an inductive load is connected to the output of the class D amplifier output stage, and the current sensing circuit is operative to sense the direction (i.e., the sign) of the current flowing through the inductive load. Further, a residual load current flows through the body diodes of the output transistors when the transistors are switched off. This residual load current comprises the sum of an average load current and a ripple load current, which is a function of the load inductance and the power supply voltage. The input provided to the gate driver circuit, the first and second drive signals applied to the output transistors, and the output of the amplifier output stage comprise respective pulses having corresponding duty cycles. It is noted that the output transistor drive pulses are non-overlapping to assure that the output transistors are not switched on at the same time. Further, the interval during which the non-overlapping drive pulses are simultaneously de-asserted is constant, and is herein referred to as the "dead time" (DT).

In this mode of operation, the gate driver circuit operates to increase or decrease the duty cycles of the output transistor drive pulses based on the direction (sign) of the residual load current flowing through the output transistors, thereby causing the duty cycle of the output pulse to remain substantially constant and equal to the duty cycle of the input pulse. The current sensing circuit operates to sense the sign of the residual load current during successive dead time intervals, and to provide an indication of the sign of the residual load current to the gate driver circuit. Specifically, in the event a positive input pulse is provided to the gate driver circuit, the gate driver circuit applies a positive first drive pulse to the gate of the first output transistor, and applies a negative second drive pulse to the gate of the second transistor.

In the event the sign of the ripple current component of the residual load current alternates between positive and negative in successive dead time intervals, the rising edge of the first drive pulse follows the rising edge of the input pulse by a time DT, and the falling edge of the first drive pulse is coincident with the falling edge of the input pulse. In the event the sign of the ripple current remains positive in successive dead time intervals, the rising edge of the first drive pulse follows the rising edge of the input pulse by a time DT, and the falling edge of the first drive pulse follows the falling edge of the input pulse by a time DT. In the event the sign of the ripple current remains negative in successive dead time intervals, the rising edge of the first drive pulse follows the rising edge of the input pulse by a time 2DT, and the falling edge of the first drive pulse is coincident with the falling edge of the input pulse. In each case, the rising edge of the first drive pulse follows the falling edge of the second drive pulse by a time DT, and the rising edge of the second drive pulse follows the falling edge of the first drive pulse by a time DT to assure that the first and second drive pulses are non-overlapping. In effect, the switching on/off of the output transistors is suitably delayed to compensate for the difference in the duty cycles of the input and output pulses.

By varying the duty cycles of the pulses driving the output transistors based on the direction of the residual load current in successive dead time intervals, as described above, the duty cycle of the output pulse can be forced to remain substantially constant and equal to the duty cycle of the input pulse. In this way, the class D amplifier output stage compensates for nonlinearity introduced by the residual load current during the dead time in the switching of the output stage.

Other features, functions, and aspects of the invention will be evident from the Detailed Description of the Invention that follows.

BRIEF DESCRIPTION OF THE SEVERAL VIEWS OF THE DRAWINGS

The invention will be more fully understood with reference to the following Detailed Description of the Invention in conjunction with the drawings of which.

DETAILED DESCRIPTION OF THE INVENTION

Figure 1:
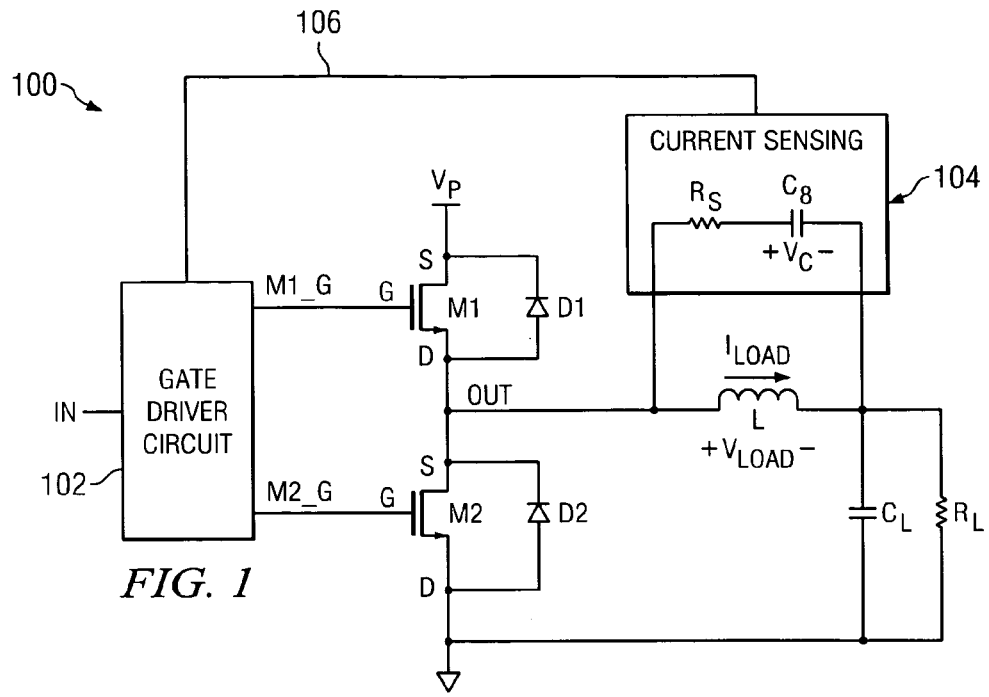
FIG. 1 is a schematic diagram of a class D amplifier output stage according to the present invention.

A method of operating a class D amplifier output stage is disclosed that compensates for nonlinearity introduced by the dead time in the switching of the output stage. FIG. 1 depicts an illustrative embodiment of a class D amplifier output stage 100, in accordance with the present invention. In the illustrated embodiment, the amplifier output stage 100 comprises an input IN, an output OUT, first and second output transistors M1–M2, a gate driver circuit 102, and a current sensing circuit 104, which includes a resistor $R_S$ and a capacitor $C_S$ connected in series across an inductive load L. For example, the output transistors M1–M2 can be respective MOSFET power transistors, or any other suitable type of transistor. In the preferred embodiment, each one of the transistors M1–M2 is an N-type double diffused MOS (DMOS) power transistor.

As shown in FIG. 1, the output transistors M1–M2 are serially connected between first and second terminals of a power supply. In the illustrated embodiment, the power supply provides voltages $V_P$ and GND at the first and second power supply terminals, respectively. It is understood, however, that the power supply can be a bipolar power supply providing voltages $V_P$ and $V_N$, in which, for example, $V_N=-V_P$. Specifically, each one of the output transistors M1–M2 has a gate electrode (G), a source electrode (S), and a drain electrode (D). The input IN of the amplifier output stage 100 is provided to the gate driver circuit 102, which applies corresponding first and second drive signals to the gate electrodes of the output transistors M1–M2, respectively. The source electrode of the output transistor M1 is connected to the first power supply terminal ($V_P$), and the drain electrode of the output transistor M2 is connected to the second power supply terminal (GND). Further, the drain electrode of the output transistor M1 is connected to the source electrode of the output transistor M2. In this configuration, the output transistor M1 is typically referred to as the "upper" transistor, and the output transistor M2 is typically referred to as the "lower" transistor. The output OUT of the amplifier output stage 100 is provided at the connection of the drain and source electrodes of the output transistors M1–M2, respectively.

In an illustrative mode of operation, a first terminal of the inductive load L is connected to the output OUT of the amplifier output stage 100. Further, a capacitor $C_L$ and a resistor $R_L$ are connected in parallel between a second terminal of the inductive load L and GND. The voltage "$v_C$" across the capacitor $C_S$ may be expressed in terms of its Laplace transform, i.e., $$v_c = \frac{1}{1+R_sC_s s}v_{load} = R_L \frac{1+\frac{L}{R_L}s}{1+R_sC_s s}I_{load}. \quad (1)$$

Accordingly, if the values of $R_S$ and $C_S$ are selected such that $L/R_L=R_S C_S$, then $$v_c = R_L I_{load} \leftrightarrow I_{load} = \frac{v_c}{R_L}. \quad (2)$$

In the illustrated embodiment, the direction or sign of the load current $I_{load}$ is positive when the current $I_{load}$ flows out of the output OUT. Moreover, the current sensing circuit 104 provides an indication of the sign of the load current $I_{load}$ to the gate driver circuit 102 via a line 106 (see FIG. 1).

It should be appreciated that the above-described implementation of the current sensing circuit 104 is provided for purposes of illustration only, and that the desired functionality of the circuit 104 may alternatively be obtained, for example, by sensing the load current $I_{load}$ flowing through a sense resistor connected in series with the inductive load L, by sensing the current flowing through the drain-source resistance ($R_{DS}$) of the respective output transistors M1–M2, by sensing the current provided by a SENSFET connected in parallel with the respective output transistors M1–M2, by integrating the voltage $V_{load}$ across the inductive load L, by transformer current sensing, or by any other suitable current sensing technique.

In this illustrative mode of operation, the current sensing circuit 104 is operative to sense the direction (sign) of the load current $I_{load}$ flowing through the inductive load L. More specifically, the current sensing circuit 104 operates to sense the sign of a residual load current $I_{load}$ flowing through body diodes D1–D2 of the respective output transistors M1–M2. Those of ordinary skill in this art will appreciate that suitable voltage levels may be applied to the gate electrode of a MOSFET transistor to switch the transistor "on" and "off" (cutoff), and that a residual current typically flows through the transistor when it is switched off. Depending upon the direction of the residual load current $I_{load}$ when both of the transistors M1–M2 are switched off, the level of the output OUT of the amplifier output stage 100 can be either $V_P + V_f$ or $GND - V_f$, in which "$V_f$" represents the forward biased diode voltage drop. It should be noted that the residual load current comprises the sum of an average load current and a ripple load current, which is a function of the inductive load L and the power supply voltage $V_P$.

Figures 2A, 2B:
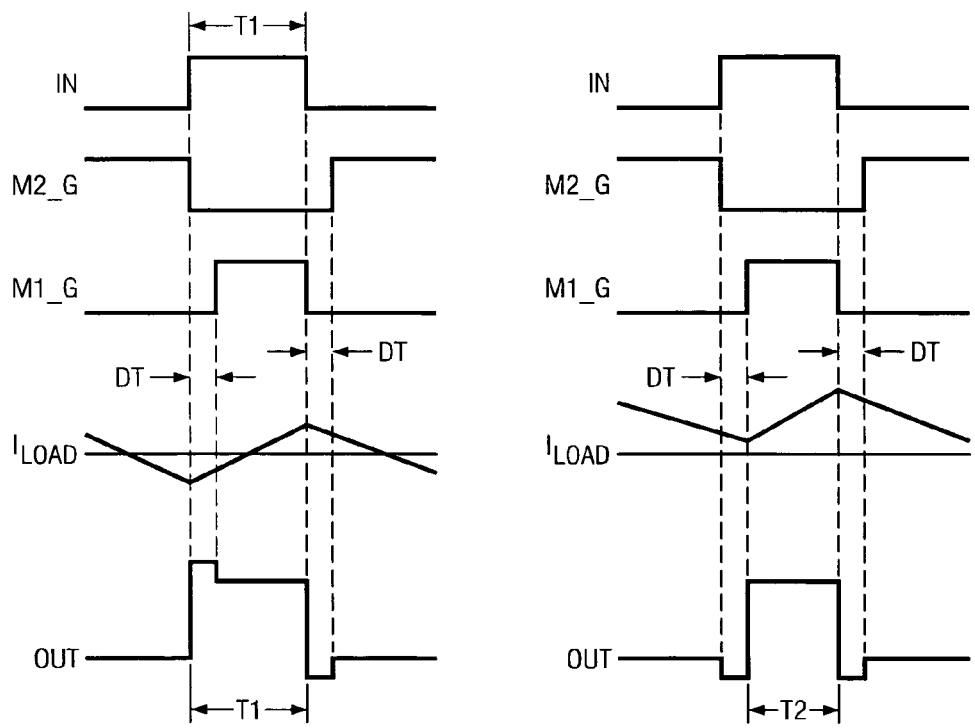
FIGS. 2a–2c are timing diagrams illustrating input pulses, drive pulses, output pulses, and residual load currents employed in the class D amplifier output stage of FIG. 1 without compensation.
Figure 2C:
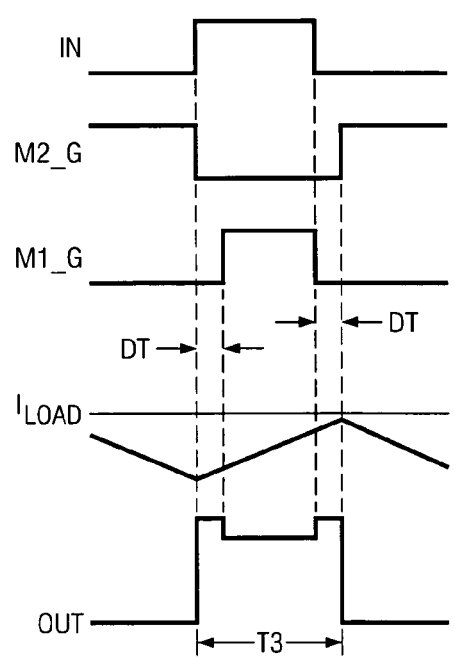

FIGS. 2a–2c depict illustrative signals representing the input IN, the first signal (M1_G) and the second signal (M2_G) driving the output transistors M1–M2, respectively, and the output OUT of the amplifier output stage 100 (see FIG. 1). In the illustrated embodiment, the input IN, the first and second drive signals M1_G, M2_G, and the output OUT comprise respective pulses having corresponding duty cycles. For example, FIG. 2a depicts the input pulse IN and the output pulse OUT having the same duty cycle T1, FIG. 2b depicts the input pulse IN and the output pulse OUT having different duty cycles T1 and T2 (T2<T1), respectively, and FIG. 2c depicts the input pulse IN and the output pulse OUT having different duty cycles T1 and T3 (T3>T1), respectively.

It is noted that each one of the drive pulses M1_G, M2_G has the same duty cycle in each representation of the respective signal depicted in FIGS. 2a–2c. As shown in FIGS. 2a–2c, the drive pulses M1_G, M2_G are non-overlapping to assure that the transistors M1–M2 are not switched on at the same time. Further, the interval during which the non-overlapping drive pulses M1_G, M2_G are simultaneously de-asserted is constant, and is herein referred to as the "dead time" (DT).

As described above, the body diodes D1–D2 of the output transistors M1–M2 allow a residual load current $I_{load}$ to flow through the transistors M1–M2 when they are switched off. The direction (sign) of this residual load current can determine the voltage level of the output pulse OUT during the dead time DT in the switching of the amplifier output stage 100 (see FIG. 1). Because the residual load current is not directly related to the input pulse IN, the residual load current $I_{load}$ can cause the duty cycle of the output pulse OUT to be different from the duty cycle of the input pulse IN.

FIGS. 2a–2c illustrate how the duty cycles of the input pulse IN and the output pulse OUT can be different, depending upon the direction (sign) of the residual load current $I_{load}$ flowing through the output transistors M1–M2 during the dead time DT. As described above, the residual load current is made up of the sum of an average load current and a ripple load current. FIGS. 2a–2c depict representations of the residual load current $I_{load}$ comprising the average current and ripple current components. For example, FIG. 2a depicts the residual load current $I_{load}$ having a non-zero ripple current component and an average current component approximately equal to zero. As a result, during the dead time (DT) from the trailing (falling) edge of the second drive signal M2_G to the leading (rising) edge of the first drive signal M1_G, the residual load current $I_{load}$ is negative, and during the dead time (DT) from the trailing (falling) edge of the first drive signal M1_G to the leading (rising) edge of the second drive signal M2_G, the residual load current $I_{load}$ is positive.

Further, FIG. 2b depicts the residual load current $I_{load}$ having a non-zero ripple current component and a positive average current component. As a result, during successive dead time (DT) intervals, the residual load current $I_{load}$ is positive. Moreover, FIG. 2c depicts the residual load current $I_{load}$ having a non-zero ripple current component and a negative average current component. As a result, during successive dead time (DT) intervals, the residual load current $I_{load}$ is negative.

Accordingly, depending upon the direction (sign) and level of the average current component of the residual load current $I_{load}$ during successive dead time (DT) intervals, the duty cycle of the output pulse OUT can be equal to the duty cycle of the input pulse IN (T1; see FIG. 2a), less than the duty cycle of the input pulse IN (T2<T1; see FIG. 2b), or greater than the duty cycle of the input pulse IN (T3>T1; see FIG. 2c). It is noted that $$T1-T2=T3-T1=DT. \qquad (3)$$

These differences in the duty cycles of the input and output pulses can cause nonlinearity to be introduced in the output of the amplifier output stage 100 (see FIG. 1), which can adversely affect specified amplifier performance characteristics such as total harmonic distortion (THD).

By varying the duty cycles of the pulses M1_G, M2_G driving the output transistors M1–M2 based on the direction of the residual load current during the dead time in the switching of the amplifier output stage 100, the duty cycle of the output pulse OUT can be forced to remain substantially constant and equal to the duty cycle of the input pulse IN, thereby minimizing nonlinearity in the output of the output stage. In the presently disclosed embodiment, the current sensing circuit 104 is operative to sense the sign of the residual load current $I_{load}$ during successive dead time (DT) intervals, and to provide an indication of the sign of the current $I_{load}$ to the gate driver circuit 102, which is operative to vary the duty cycles of the drive pulses M1_G, M2_G based on whether the sign of the current $I_{load}$ alternates between positive and negative, remains positive, or remains negative, in the successive dead time (DT) intervals. In one embodiment, the gate driver circuit 102 varies the duty cycles of the drive pulses M1_G, M2_G by applying appropriate delays to the rising/falling edges of the respective pulses. For example, the gate driver circuit 102 can be a pulse width modulator, or any other suitable circuit for varying the duty cycles of the respective drive pulses M1_G, M2_G.

Figure 3A:
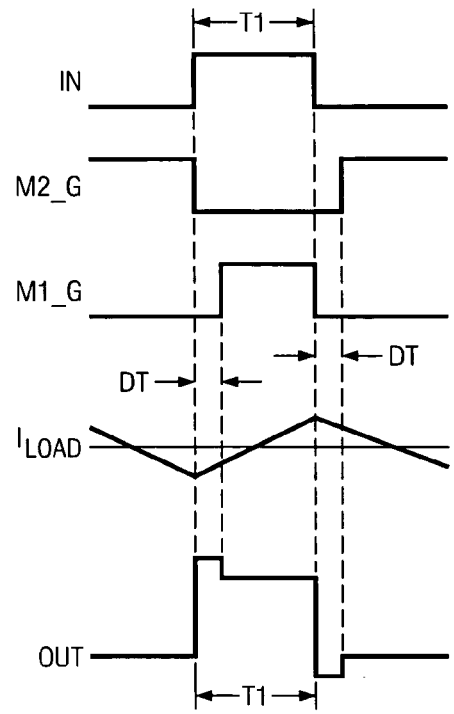
FIGS. 3a–3c are timing diagrams illustrating input pulses, drive pulses, output pulses, and residual load currents employed in the class D amplifier output stage of FIG. 1 with compensation.
Figure 3B:
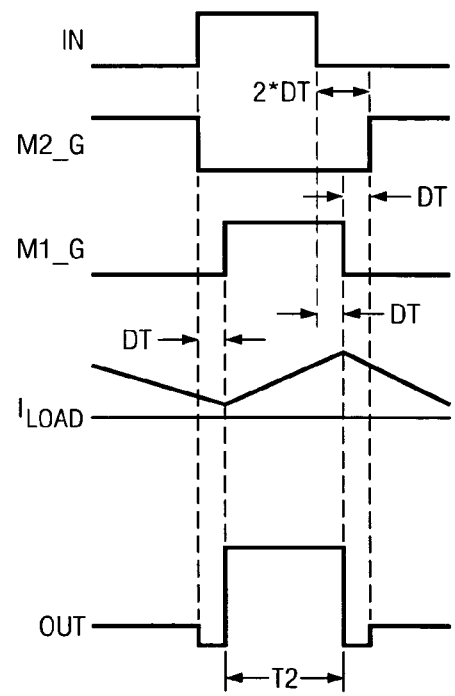
Figure 3C:
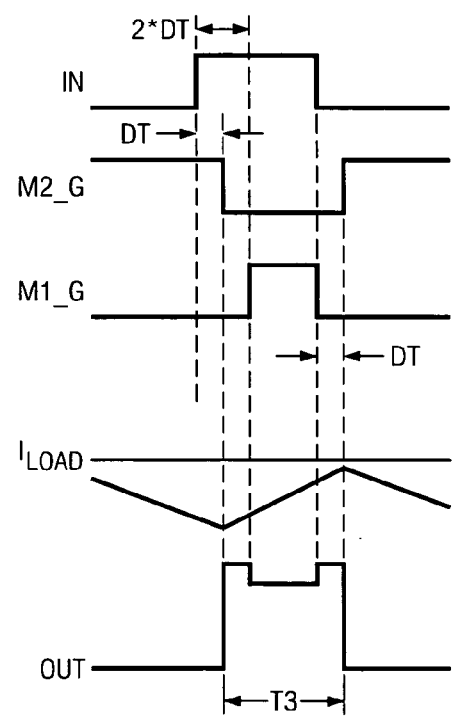

FIGS. 3a–3c depict illustrative signals representing the input IN, the first drive signal M1_G, the second drive signal M2_G, and the output OUT of the amplifier output stage 100 (see FIG. 1). FIGS. 3a–3c also depict representations of the residual load current $I_{load}$, which are the same as those depicted in FIGS. 2a–2c. As shown in FIGS. 3a–3c, the drive pulses M1_G, M2_G are non-overlapping to assure that the transistors M1–M2 are not switched on at the same time. Further, the interval during which the non-overlapping drive pulses M1_G, M2_G are simultaneously de-asserted is equal to the dead time (DT). Moreover, the duty cycles of the drive pulses M1_G, M2_G are varied based on the sign of the residual load current $I_{load}$ to compensate for the differences in the duty cycles of the input pulse IN and the output pulse OUT, as illustrated in FIGS. 2a–2c.

Specifically, FIG. 3a depicts the input pulse IN and the output pulse OUT having the same duty cycle T1. As shown in FIG. 3a, the sign of the residual load current $I_{load}$ alternates between positive and negative during successive dead time (DT) intervals. To assure that the output pulse OUT has substantially the same duty cycle as the input pulse IN when the sign of the residual load current $I_{load}$ remains positive (see FIG. 3b) or remains negative (see FIG. 3c) in successive dead time (DT) intervals, the switching off or switching on of the transistors M1–M2 by the respective drive pulses M1_G, M2_G is delayed.

For example, in the event the sign of the ripple current component of the residual load current $I_{load}$ alternates between positive and negative during successive dead time (DT) intervals, the rising edge of the drive pulse M1_G follows the rising edge of the input pulse IN by a time DT, the falling edge of the drive pulse M1_G is coincident with the falling edge of the input pulse IN, and the duty cycle T1 of the output pulse OUT is the same as the duty cycle T1 of the input pulse IN (see FIG. 3a). In the event the sign of the ripple current remains positive in successive dead time (DT) intervals, the rising edge of the drive pulse M1_G follows the rising edge of the input pulse IN by a time DT, and the falling edge of the drive pulse M1_G follows the falling edge of the input pulse IN by a time DT, thereby causing the duty cycle T2 of the output pulse OUT to be substantially the same as the duty cycle T1 of the input pulse IN (T2=T1; see FIG. 3b). In the event the sign of the ripple current remains negative in successive dead time (DT) intervals, the rising edge of the drive pulse M1_G follows the rising edge of the input pulse IN by a time 2DT, and the falling edge of the drive pulse M1_G is coincident with the falling edge of the input pulse IN, thereby causing the duty cycle T3 of the output pulse OUT to be substantially the same as the duty cycle T1 of the input pulse IN (T3=T1; see FIG. 3c). It is noted that when the rising edge of the drive pulse M1_G follows the rising edge of the input pulse IN by a time 2DT, the falling edge of the drive pulse M2_G follows the rising edge of the input pulse IN by a time DT.

Figure 4:
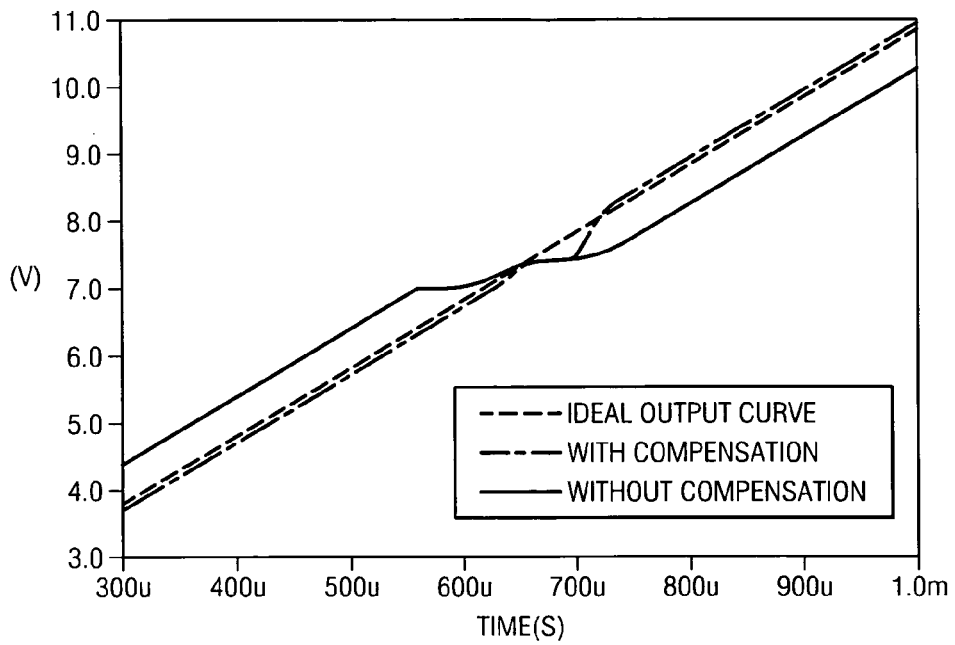
FIG. 4 is a diagram of illustrative outputs of the class D amplifier output stage of FIG. 1 with and without compensation.

The functionality of the presently disclosed class D amplifier output stage will be better understood with reference to the following illustrative example and FIGS. 1 and 4. In this example, the power supply voltage $V_P$ equals +14.4 volts, the dead time (DT) equals 100 nsecs, the inductive load L equals 30 µH, the capacitor $C_L$ equals 220 nF, and the resistor $R_L$ equals 2Ω. Further, a ramp voltage is applied to the input IN of the amplifier output stage 100 over an 800 µsec interval, causing the duty cycle of the input pulse IN to gradually increase from 0% (IN=0 volts) to 100% (IN=$V_P$).

FIG. 4 depicts the transient simulation results for this illustrative example, including representations of the average output voltage OUT with and without compensation. FIG. 4 also depicts a representation of the ideal output voltage OUT for the amplifier output stage for comparison. It is understood that the average output voltage OUT without compensation, as depicted in FIG. 4, corresponds to the case illustrated in FIGS. 2a–2c, in which the duty cycle of the output pulse OUT can be different from the duty cycle of the input pulse IN. Further, the average output voltage OUT with compensation, as depicted in FIG. 4, corresponds to the case illustrated in FIGS. 3a–3c, in which the duty cycle of the output pulse OUT is substantially constant and equal to the duty cycle of the input pulse IN. As shown in FIG. 4, the nonlinearity in the average output voltage OUT with compensation is significantly less than the nonlinearity in the average output voltage OUT without compensation.

Figure 5:
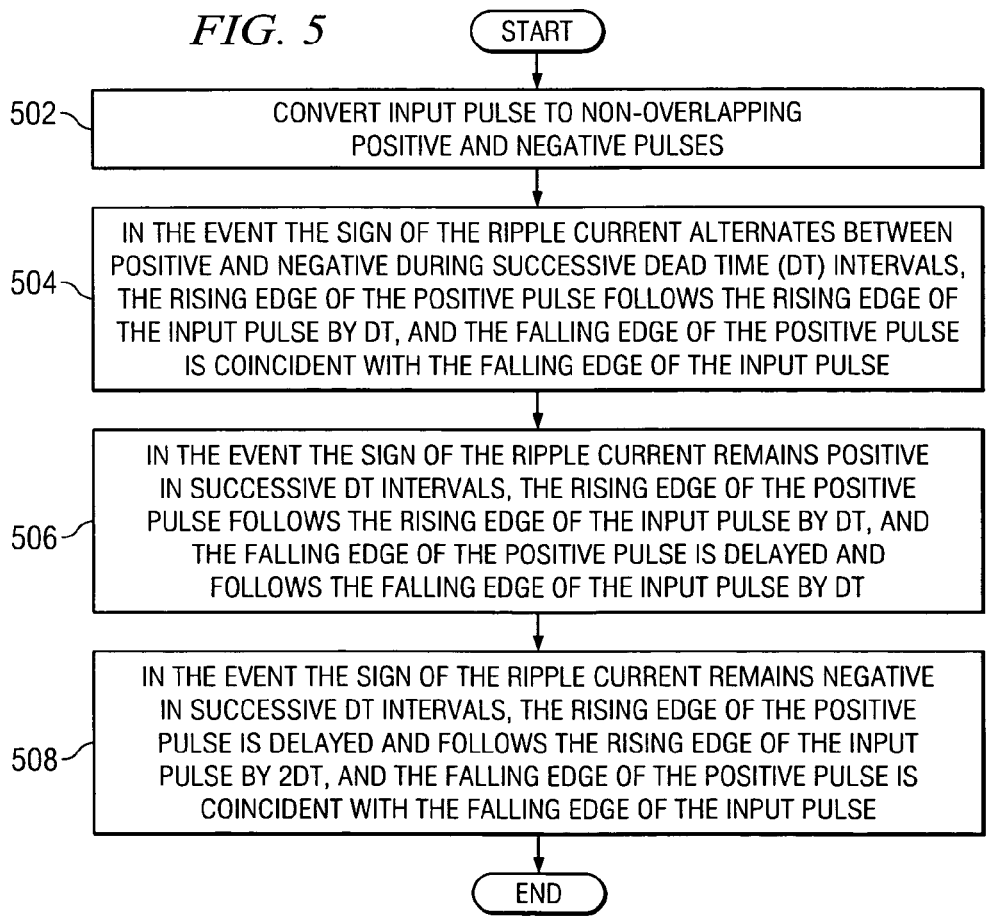
FIG. 5 is a flow diagram of a method of operating the class D amplifier output stage of FIG. 1.

A method of operating the presently disclosed class D amplifier output stage is illustrated with reference to FIG. 5. As depicted in step 502, a positive input pulse is converted to non-overlapping positive and negative pulses, which are applied to the upper and lower output transistors, respectively, of the output stage. It is understood that the interval during which the non-overlapping positive and negative pulses are de-asserted is equal to the dead time DT. In the event the sign of the ripple current component of the residual load current alternates between positive and negative during successive dead time (DT) intervals in the switching of the output stage, the rising edge of the positive pulse driving the upper output transistor follows the rising edge of the input pulse by a time DT, and the falling edge of this positive pulse is coincident with the falling edge of the input pulse, as depicted in step 504. In the event the sign of the ripple current remains positive in successive dead time (DT) intervals, the rising edge of the positive pulse driving the upper output transistor follows the rising edge of the input pulse by a time DT, and the falling edge of this positive pulse is delayed and follows the falling edge of the input pulse by a time DT, as depicted in step 506. In the event the sign of the ripple current remains negative in successive dead time (DT) intervals, the rising edge of the positive pulse driving the upper output transistor is delayed and follows the rising edge of the input pulse by a time 2DT, and the falling edge of this positive pulse is coincident with the falling edge of the input pulse, as depicted in step 508. As a result, the duty cycles of the input pulse and the output pulse in steps 504, 506, and 508 are substantially the same.

It will further be appreciated by those of ordinary skill in the art that modifications to and variations of the above-described compensation of nonlinearity introduced by dead time in a switching output stage may be made without departing from the inventive concepts disclosed herein. Accordingly, the invention should not be viewed as limited except as by the scope and spirit of the appended claims.

What is claimed is:

1. A class D amplifier output stage, comprising:
   an input configured to receive an input signal;
   an output configured to provide an output signal, the output being coupleable to a load;
   upper and lower output transistors operatively coupled to the output;
   a driver circuit configured to receive the input signal, and to generate non-overlapping first and second signals for driving the upper and lower output transistors, respectively,
   wherein the driver circuit is operative to apply the first and second drive signals to the upper and lower transistors, respectively, wherein a leading edge of the first drive signal follows a leading edge of the input signal by a dead time, and a trailing edge of the first drive signal is coincident with a trailing edge of the input signal, and
   wherein the input signal, the output signal, and the first and second drive signals have respective duty cycles; and
   a current sensing circuit configured to determine a direction of a current flowing through the load during at least two dead time intervals,
   wherein the driver circuit is further operative, in the event the direction of the load current corresponds to a first predetermined direction during the two dead time intervals, to vary the duty cycles of the respective first and second drive signals so that the leading edge of the first drive signal follows the leading edge of the input signal by a dead time, and the trailing edge of the first drive signal follows the trailing edge of the input signal by a dead time, thereby causing the duty cycle of the output signal to be substantially equal to the duty cycle of the input signal.

2. The class D amplifier output stage of claim 1 wherein the two dead time intervals are successive dead time intervals.

3. The class D amplifier output stage of claim 1 wherein the driver circuit is further operative, in the event the direction of the load current corresponds to a second predetermined direction during the two dead time intervals, to vary the duty cycles of the respective first and second drive signals so that the leading edge of the first drive signal follows the leading edge of the input signal by two dead times, and the trailing edge of the first drive signal is coincident with the trailing edge of the input signal.

4. The class D amplifier output stage of claim 3 wherein the two dead time intervals are successive dead time intervals.

5. The class D amplifier output stage of claim 1 wherein the upper and lower output transistors comprise respective MOSFET transistors.

6. The class D amplifier output stage of claim 5 wherein the upper and lower output transistors comprise respective double diffused MOS (DMOS) power transistors.

7. The class D amplifier output stage of claim 1 wherein the upper and lower output transistors are coupled between upper and lower terminals of a power supply.

8. The class D amplifier output stage of claim 7 wherein the power supply is a bipolar power supply.

9. The class D amplifier output stage of claim 1 wherein the driver circuit comprises a pulse width modulator.

10. A method of operating a class D amplifier output stage, comprising the steps of:
converting an input signal to non-overlapping first and second signals for driving upper and lower output transistors, respectively, of the amplifier output stage, the first and second drive signals having respective duty cycles, the upper and lower transistors being coupleable to a load;

applying the first and second drive signals to the upper and lower transistors, respectively, wherein a leading edge of the first drive signal follows a leading edge of the input signal by a dead time, and a trailing edge of the first drive signal is coincident with a trailing edge of the input signal, thereby generating an output signal;

determining a direction of a current flowing through the load during at least two dead time intervals; and in the event the direction of the load current corresponds to a first predetermined direction during the two dead time intervals, varying the duty cycles of the respective first and second drive signals so that the leading edge of the first drive signal follows the leading edge of the input signal by a dead time, and the trailing edge of the first drive signal follows the trailing edge of the input signal by a dead time; and thereby causing respective duty cycles of the input and output signals to be substantially the same.

11. The method of claim 10 wherein the two dead time intervals are successive dead time intervals.

12. The method of claim 10 further including the step of, in the event the direction of the load current corresponds to a second predetermined direction during the two dead time intervals, varying the duty cycles of the respective first and second drive signals so that the leading edge of the first drive signal follows the leading edge of the input signal by two dead times, and the trailing edge of the first drive signal is coincident with the trailing edge of the input signal.

13. The method of claim 12 wherein the two dead time intervals are successive dead time intervals.

* * * * *